US012568694B2

(12) United States Patent

Kuo et al.

(10) Patent No.: US 12,568,694 B2

(45) Date of Patent: Mar. 3, 2026

(54) PHOTOVOLTAIC MODULE WITH A LAMINATED POTTED PRINTED CIRCUIT BOARD

(71) Applicant: GAF Energy LLC, Parsippany, NJ (US)

(72) Inventors: Dawei Kuo, Fremont, CA (US); Lewis Abra, San Francisco, CA (US); Richard Perkins, San Jose, CA (US)

(73) Assignee: GAF Energy LLC, Parsippany, NJ (US)

( * ) Notice: Subject to any disclaimer, the term of this patent is extended or adjusted under 35 U.S.C. 154(b) by 0 days.

(21) Appl. No.: 17/698,563

(22) Filed: Mar. 18, 2022

(65) Prior Publication Data

US 2022/0302329 A1     Sep. 22, 2022

Related U.S. Application Data

(60) Provisional application No. 63/163,542, filed on Mar. 19, 2021.

(51) Int. Cl.
*H10F 19/80*        (2025.01)
*H02S 40/30*        (2014.01)
(Continued)

(52) U.S. Cl.
CPC ............. *H10F 19/80* (2025.01); *H02S 40/34* (2014.12); *H05K 3/0058* (2013.01);
(Continued)

(58) Field of Classification Search
CPC ........ H10D 19/80; H10F 19/80; H10F 77/95; H05K 3/284; H05K 2203/1327
(Continued)

(56) References Cited

U.S. PATENT DOCUMENTS 1,981,467 A     11/1934   Radtke
3,156,497 A     11/1964   Lessard
(Continued)

FOREIGN PATENT DOCUMENTS

CA        2829440 C     5/2019
CH          700095 A2    6/2010
(Continued)

OTHER PUBLICATIONS

Cover—Definition and Meaning.Encyclopedia Britannica, Encyclopedia Britannica, inc., www.britannica.com/dictionary/cover. Accessed May 29, 2024. (Year: 2024).*

(Continued)

*Primary Examiner* — Kourtney R S Carlson
(74) *Attorney, Agent, or Firm* — GREENBERG TRAURIG, LLP

(57)        ABSTRACT

Some embodiments of the present disclosure relate to a system. In some embodiments, the system includes a photovoltaic module and a module-level power electronics device electrically connected to the photovoltaic module. In some embodiments, the module-level power electronics device comprises a laminated potted printed circuit board. In some embodiments, the laminated potted printed circuit board comprises a potted printed circuit board and an encapsulant covering the potted printed circuit board. In some embodiments, the potted printed circuit board comprises: a printed circuit board having a top surface, and a pottant covering the top surface of the printed circuit board. In some embodiments, the laminated potted printed circuit board is substantially void-free.

18 Claims, 6 Drawing Sheets

(51) Int. Cl.
   *H02S 40/34*          (2014.01)
   *H05K 3/00*          (2006.01)
   *H10F 77/00*          (2025.01)

(52) U.S. Cl.
   CPC ............ *H10F 77/935* (2025.01); *H02S 40/30*
      (2014.12); *H10F 77/95* (2025.01)

(58) Field of Classification Search
   USPC ................................................ 136/251–265
   See application file for complete search history.

(56)                 References Cited

U.S. PATENT DOCUMENTS

| | | | |
|---|---|---|---|
| 3,581,779 | A | 6/1971 | Gilbert, Jr. |
| 4,258,948 | A | 3/1981 | Hoffmann |
| 4,349,220 | A | 9/1982 | Carroll et al. |
| 4,499,702 | A | 2/1985 | Turner |
| 4,636,577 | A | 1/1987 | Peterpaul |
| 5,167,579 | A | 12/1992 | Rotter |
| 5,437,735 | A | 8/1995 | Younan et al. |
| 5,590,495 | A | 1/1997 | Bressler et al. |
| 5,642,596 | A | 7/1997 | Waddington |
| 6,008,450 | A | 12/1999 | Ohtsuka et al. |
| 6,033,270 | A | 3/2000 | Stuart |
| 6,046,399 | A | 4/2000 | Kapner |
| 6,201,180 | B1 | 3/2001 | Meyer et al. |
| 6,220,329 | B1 | 4/2001 | King et al. |
| 6,308,482 | B1 | 10/2001 | Strait |
| 6,320,114 | B1 | 11/2001 | Kuechler |
| 6,320,115 | B1 | 11/2001 | Kataoka et al. |
| 6,336,304 | B1 | 1/2002 | Mimura et al. |
| 6,341,454 | B1 | 1/2002 | Koleoglou |
| 6,407,329 | B1 | 6/2002 | Iino et al. |
| 6,576,830 | B2 | 6/2003 | Nagao et al. |
| 6,928,781 | B2 | 8/2005 | Desbois et al. |
| 6,972,367 | B2 | 12/2005 | Federspiel et al. |
| 7,138,578 | B2 | 11/2006 | Komamine |
| 7,155,870 | B2 | 1/2007 | Almy |
| 7,178,295 | B2 | 2/2007 | Dinwoodie |
| 7,487,771 | B1 | 2/2009 | Eiffert et al. |
| 7,587,864 | B2 | 9/2009 | McCaskill et al. |
| 7,678,990 | B2 | 3/2010 | McCaskill et al. |
| 7,678,991 | B2 | 3/2010 | McCaskill et al. |
| 7,748,191 | B2 | 7/2010 | Podirsky |
| 7,819,114 | B2 | 10/2010 | Augenbraun et al. |
| 7,824,191 | B1 | 11/2010 | Podirsky |
| 7,832,176 | B2 | 11/2010 | McCaskill et al. |
| 8,118,109 | B1 | 2/2012 | Hacker |
| 8,168,880 | B2 | 5/2012 | Jacobs et al. |
| 8,173,889 | B2 | 5/2012 | Kalkanoglu et al. |
| 8,210,570 | B1 | 7/2012 | Railkar et al. |
| 8,276,329 | B2 | 10/2012 | Lenox |
| 8,312,693 | B2 | 11/2012 | Cappelli |
| 8,319,093 | B2 | 11/2012 | Kalkanoglu et al. |
| 8,333,040 | B2 | 12/2012 | Shiao et al. |
| 8,371,076 | B2 | 2/2013 | Jones et al. |
| 8,375,653 | B2 | 2/2013 | Shiao et al. |
| 8,404,967 | B2 | 3/2013 | Kalkanoglu et al. |
| 8,410,349 | B2 | 4/2013 | Kalkanoglu et al. |
| 8,418,415 | B2 | 4/2013 | Shiao et al. |
| 8,438,796 | B2 | 5/2013 | Shiao et al. |
| 8,468,754 | B2 | 6/2013 | Railkar et al. |
| 8,468,757 | B2 | 6/2013 | Krause et al. |
| 8,505,249 | B2 | 8/2013 | Geary |
| 8,512,866 | B2 | 8/2013 | Taylor |
| 8,513,517 | B2 | 8/2013 | Kalkanoglu et al. |
| 8,586,856 | B2 | 11/2013 | Kalkanoglu et al. |
| 8,601,754 | B2 | 12/2013 | Jenkins et al. |
| 8,629,578 | B2 | 1/2014 | Kurs et al. |
| 8,646,228 | B2 | 2/2014 | Jenkins |
| 8,656,657 | B2 | 2/2014 | Livsey et al. |
| 8,671,630 | B2 | 3/2014 | Lena et al. |
| 8,677,702 | B2 | 3/2014 | Jenkins |
| 8,695,289 | B2 | 4/2014 | Koch et al. |
| 8,713,858 | B1 | 5/2014 | Xie |

| | | | |
|---|---|---|---|
| 8,713,860 | B2 | 5/2014 | Railkar et al. |
| 8,733,038 | B2 | 5/2014 | Kalkanoglu et al. |
| 8,776,455 | B2 | 7/2014 | Azoulay |
| 8,789,321 | B2 | 7/2014 | Ishida |
| 8,793,940 | B2 | 8/2014 | Kalkanoglu et al. |
| 8,793,941 | B2 | 8/2014 | Bosler et al. |
| 8,826,607 | B2 | 9/2014 | Shiao et al. |
| 8,835,751 | B2 | 9/2014 | Kalkanoglu et al. |
| 8,863,451 | B2 | 10/2014 | Jenkins et al. |
| 8,898,970 | B2 | 12/2014 | Jenkins et al. |
| 8,925,262 | B2 | 1/2015 | Railkar et al. |
| 8,943,766 | B2 | 2/2015 | Gombarick et al. |
| 8,946,544 | B2 | 2/2015 | Jabos et al. |
| 8,950,128 | B2 | 2/2015 | Kalkanoglu et al. |
| 8,959,848 | B2 | 2/2015 | Jenkins et al. |
| 8,966,838 | B2 | 3/2015 | Jenkins |
| 8,966,850 | B2 | 3/2015 | Jenkins et al. |
| 8,994,224 | B2 | 3/2015 | Mehta et al. |
| 9,032,672 | B2 | 5/2015 | Livsey et al. |
| 9,153,950 | B2 | 10/2015 | Yamanaka et al. |
| 9,166,087 | B2 | 10/2015 | Chihlas et al. |
| 9,169,646 | B2 | 10/2015 | Rodrigues et al. |
| 9,170,034 | B2 | 10/2015 | Bosler et al. |
| 9,178,465 | B2 | 11/2015 | Shiao et al. |
| 9,202,955 | B2 | 12/2015 | Livsey et al. |
| 9,212,832 | B2 | 12/2015 | Jenkins |
| 9,217,584 | B2 | 12/2015 | Kalkanoglu et al. |
| 9,270,221 | B2 | 2/2016 | Zhao |
| 9,273,885 | B2 | 3/2016 | Rordigues et al. |
| 9,276,141 | B2 | 3/2016 | Kalkanoglu et al. |
| 9,331,224 | B2 | 5/2016 | Koch et al. |
| 9,356,174 | B2 | 5/2016 | Duarte et al. |
| 9,359,014 | B1 | 6/2016 | Yang et al. |
| 9,412,890 | B1 | 8/2016 | Meyers |
| 9,528,270 | B2 | 12/2016 | Jenkins et al. |
| 9,577,131 | B2 | 2/2017 | Saito et al. |
| 9,605,432 | B1 | 3/2017 | Robbins |
| 9,711,672 | B2 | 7/2017 | Wang |
| 9,755,573 | B2 | 9/2017 | Livsey et al. |
| 9,786,802 | B2 | 10/2017 | Shiao et al. |
| 9,831,818 | B2 | 11/2017 | West |
| 9,912,284 | B2 | 3/2018 | Svec |
| 9,917,213 | B2 | 3/2018 | Ehrenpfordt et al. |
| 9,923,515 | B2 | 3/2018 | Rodrigues et al. |
| 9,938,729 | B2 | 4/2018 | Coon |
| 9,991,412 | B2 | 6/2018 | Gonzalez et al. |
| 9,998,067 | B2 | 6/2018 | Kalkanoglu et al. |
| 10,027,273 | B2 | 7/2018 | West et al. |
| 10,115,850 | B2 | 10/2018 | Rodrigues et al. |
| 10,128,660 | B1 | 11/2018 | Apte et al. |
| 10,156,075 | B1 | 12/2018 | McDonough |
| 10,187,005 | B2 | 1/2019 | Rodrigues et al. |
| 10,256,765 | B2 | 4/2019 | Rodrigues et al. |
| 10,284,136 | B1 | 5/2019 | Mayfield et al. |
| 10,454,408 | B2 | 10/2019 | Livsey et al. |
| 10,530,292 | B1 | 1/2020 | Cropper et al. |
| 10,560,048 | B2 | 2/2020 | Fisher et al. |
| 10,563,406 | B2 | 2/2020 | Kalkanoglu et al. |
| D879,031 | S | 3/2020 | Lance et al. |
| 10,579,028 | B1 | 3/2020 | Jacob |
| 10,784,813 | B2 | 9/2020 | Kalkanoglu et al. |
| D904,289 | S | 12/2020 | Lance et al. |
| 11,012,026 | B2 | 5/2021 | Kalkanoglu et al. |
| 11,177,639 | B1 | 11/2021 | Nguyen et al. |
| 11,217,715 | B2 | 1/2022 | Sharenko et al. |
| 11,251,744 | B1 | 2/2022 | Bunea et al. |
| 11,258,399 | B2 | 2/2022 | Kalkanoglu et al. |
| 11,283,394 | B2 | 3/2022 | Perkins et al. |
| 11,309,828 | B2 | 4/2022 | Sirski et al. |
| 11,394,344 | B2 | 7/2022 | Perkins et al. |
| 11,424,379 | B2 | 8/2022 | Sharenko et al. |
| 11,431,280 | B2 | 8/2022 | Liu et al. |
| 11,431,281 | B2 | 8/2022 | Perkins et al. |
| 11,444,569 | B2 | 9/2022 | Clemente et al. |
| 11,454,027 | B2 | 9/2022 | Kuiper et al. |
| 11,459,757 | B2 | 10/2022 | Nguyen et al. |
| 11,486,144 | B2 | 11/2022 | Bunea et al. |
| 11,489,482 | B2 | 11/2022 | Peterson et al. |
| 11,496,088 | B2 | 11/2022 | Sirski et al. |

(56)                 References Cited

U.S. PATENT DOCUMENTS

| | | | |
|---|---|---|---|
| 11,508,861 B1 | 11/2022 | Perkins et al. | |
| 11,512,480 B1 | 11/2022 | Achor et al. | |
| 11,527,665 B2 | 12/2022 | Boitnott | |
| 11,545,927 B2 | 1/2023 | Abra et al. | |
| 11,545,928 B2 | 1/2023 | Perkins et al. | |
| 11,658,470 B2 | 5/2023 | Nguyen et al. | |
| 11,661,745 B2 | 5/2023 | Bunea et al. | |
| 11,689,149 B2 | 6/2023 | Clemente et al. | |
| 11,705,531 B2 | 7/2023 | Sharenko et al. | |
| 11,728,759 B2 | 8/2023 | Nguyen et al. | |
| 11,732,490 B2 | 8/2023 | Achor et al. | |
| 11,811,361 B1 | 11/2023 | Farhangi et al. | |
| 11,824,486 B2 | 11/2023 | Nguyen et al. | |
| 11,824,487 B2 | 11/2023 | Nguyen et al. | |
| 11,843,067 B2 | 12/2023 | Nguyen et al. | |
| 2002/0053360 A1 | 5/2002 | Kinoshita et al. | |
| 2002/0129849 A1 | 9/2002 | Heckeroth | |
| 2003/0101662 A1 | 6/2003 | Ullman | |
| 2003/0132265 A1 | 7/2003 | Villela et al. | |
| 2003/0217768 A1 | 11/2003 | Guha | |
| 2004/0000334 A1 | 1/2004 | Ressler | |
| 2005/0030187 A1 | 2/2005 | Peress et al. | |
| 2005/0115603 A1 | 6/2005 | Yoshida et al. | |
| 2005/0144870 A1 | 7/2005 | Dinwoodie | |
| 2005/0178428 A1 | 8/2005 | Laaly et al. | |
| 2005/0193673 A1 | 9/2005 | Rodrigues et al. | |
| 2006/0042683 A1 | 3/2006 | Gangemi | |
| 2006/0046084 A1 | 3/2006 | Yang et al. | |
| 2007/0074757 A1 | 4/2007 | Mellott et al. | |
| 2007/0181174 A1 | 8/2007 | Ressler | |
| 2007/0193618 A1 | 8/2007 | Bressler et al. | |
| 2007/0249194 A1 | 10/2007 | Liao | |
| 2007/0295385 A1 | 12/2007 | Sheats et al. | |
| 2008/0006323 A1 | 1/2008 | Kalkanoglu et al. | |
| 2008/0035140 A1 | 2/2008 | Placer et al. | |
| 2008/0078440 A1 | 4/2008 | Lim et al. | |
| 2008/0185748 A1 | 8/2008 | Kalkanoglu | |
| 2008/0271774 A1 | 11/2008 | Kalkanoglu et al. | |
| 2008/0302030 A1 | 12/2008 | Stancel et al. | |
| 2008/0315061 A1 | 12/2008 | Fath | |
| 2009/0000222 A1 | 1/2009 | Kalkanoglu et al. | |
| 2009/0014057 A1 | 1/2009 | Croft et al. | |
| 2009/0014058 A1 | 1/2009 | Croft et al. | |
| 2009/0019795 A1 | 1/2009 | Szacsvay et al. | |
| 2009/0044850 A1 | 2/2009 | Kimberley | |
| 2009/0114261 A1 | 5/2009 | Stancel et al. | |
| 2009/0133340 A1 | 5/2009 | Shiao et al. | |
| 2009/0159118 A1 | 6/2009 | Kalkanoglu et al. | |
| 2009/0178350 A1 | 7/2009 | Kalkanoglu et al. | |
| 2009/0229652 A1 | 9/2009 | Mapel et al. | |
| 2009/0275247 A1 | 11/2009 | Richter et al. | |
| 2010/0019580 A1 | 1/2010 | Croft et al. | |
| 2010/0095618 A1 | 4/2010 | Edison et al. | |
| 2010/0101634 A1 | 4/2010 | Frank et al. | |
| 2010/0116325 A1 | 5/2010 | Nikoonahad | |
| 2010/0131108 A1 | 5/2010 | Meyer | |
| 2010/0139184 A1 | 6/2010 | Williams et al. | |
| 2010/0146878 A1 | 6/2010 | Koch et al. | |
| 2010/0159221 A1 | 6/2010 | Kourtakis et al. | |
| 2010/0170169 A1 | 7/2010 | Railkar et al. | |
| 2010/0186798 A1 | 7/2010 | Tormen et al. | |
| 2010/0242381 A1 | 9/2010 | Jenkins | |
| 2010/0313499 A1 | 12/2010 | Gangemi | |
| 2010/0325976 A1 | 12/2010 | DeGenfelder et al. | |
| 2010/0326488 A1 | 12/2010 | Aue et al. | |
| 2010/0326501 A1 | 12/2010 | Zhao et al. | |
| 2011/0030761 A1 | 2/2011 | Kalkanoglu et al. | |
| 2011/0036386 A1 | 2/2011 | Browder | |
| 2011/0036389 A1 | 2/2011 | Hardikar et al. | |
| 2011/0048507 A1 | 3/2011 | Livsey et al. | |
| 2011/0058337 A1 | 3/2011 | Han et al. | |
| 2011/0061326 A1 | 3/2011 | Jenkins | |
| 2011/0100436 A1 | 5/2011 | Cleereman et al. | |
| 2011/0104488 A1 | 5/2011 | Muessig et al. | |
| 2011/0132427 A1 | 6/2011 | Kalkanoglu et al. | |
| 2011/0168238 A1 | 7/2011 | Metin et al. | |
| 2011/0239555 A1 | 10/2011 | Cook et al. | |
| 2011/0302859 A1 | 12/2011 | Crasnianski | |
| 2011/0314753 A1 | 12/2011 | Farmer et al. | |
| 2012/0034799 A1 | 2/2012 | Hunt | |
| 2012/0060434 A1 | 3/2012 | Jacobs | |
| 2012/0060902 A1 | 3/2012 | Drake | |
| 2012/0085392 A1 | 4/2012 | Albert et al. | |
| 2012/0137600 A1 | 6/2012 | Jenkins | |
| 2012/0176077 A1 | 7/2012 | Oh et al. | |
| 2012/0212065 A1 | 8/2012 | Cheng et al. | |
| 2012/0233940 A1 | 9/2012 | Perkins et al. | |
| 2012/0240490 A1 | 9/2012 | Gangemi | |
| 2012/0260977 A1 | 10/2012 | Stancel | |
| 2012/0266942 A1 | 10/2012 | Komatsu et al. | |
| 2012/0279150 A1 | 11/2012 | Pislkak et al. | |
| 2012/0282437 A1 | 11/2012 | Clark et al. | |
| 2012/0291848 A1 | 11/2012 | Sherman et al. | |
| 2013/0008499 A1 | 1/2013 | Verger et al. | |
| 2013/0014455 A1 | 1/2013 | Grieco | |
| 2013/0093554 A1 | 4/2013 | Fornage et al. | |
| 2013/0094151 A1 | 4/2013 | Escamilla et al. | |
| 2013/0104982 A1* | 5/2013 | Gonzalez | H01L 31/02008 |
| | | | 228/110.1 |
| 2013/0118558 A1 | 5/2013 | Sherman | |
| 2013/0146118 A1* | 6/2013 | Kelley | H02S 40/34 |
| | | | 174/541 |
| 2013/0193769 A1 | 8/2013 | Mehta et al. | |
| 2013/0247988 A1 | 9/2013 | Reese et al. | |
| 2013/0284267 A1 | 10/2013 | Plug et al. | |
| 2013/0306137 A1 | 11/2013 | Ko | |
| 2014/0090697 A1 | 4/2014 | Rodrigues et al. | |
| 2014/0150843 A1 | 6/2014 | Pearce et al. | |
| 2014/0173997 A1 | 6/2014 | Jenkins | |
| 2014/0179220 A1 | 6/2014 | Railkar et al. | |
| 2014/0182222 A1 | 7/2014 | Kalkanoglu et al. | |
| 2014/0208675 A1 | 7/2014 | Beerer et al. | |
| 2014/0254776 A1 | 9/2014 | O'Connor et al. | |
| 2014/0266289 A1 | 9/2014 | Della Sera et al. | |
| 2014/0305900 A1* | 10/2014 | Rogers | H05K 1/0286 |
| | | | 216/13 |
| 2014/0311556 A1 | 10/2014 | Feng et al. | |
| 2014/0352760 A1 | 12/2014 | Haynes et al. | |
| 2014/0366464 A1 | 12/2014 | Rodrigues et al. | |
| 2015/0089895 A1 | 4/2015 | Leitch | |
| 2015/0162459 A1 | 6/2015 | Lu et al. | |
| 2015/0263208 A1* | 9/2015 | Fisher | H01L 31/0481 |
| | | | 156/286 |
| 2015/0340516 A1 | 11/2015 | Kim et al. | |
| 2015/0349173 A1 | 12/2015 | Morad et al. | |
| 2016/0105144 A1 | 4/2016 | Haynes et al. | |
| 2016/0142008 A1 | 5/2016 | Lopez et al. | |
| 2016/0254776 A1 | 9/2016 | Rodrigues et al. | |
| 2016/0276508 A1 | 9/2016 | Huang et al. | |
| 2016/0295702 A1* | 10/2016 | Heikkinen | H05K 1/186 |
| 2016/0345437 A1* | 11/2016 | Heikkinen | H01L 51/0097 |
| 2016/0359451 A1 | 12/2016 | Mao et al. | |
| 2017/0159292 A1 | 6/2017 | Chihlas et al. | |
| 2017/0179319 A1 | 6/2017 | Yamashita et al. | |
| 2017/0179726 A1 | 6/2017 | Garrity et al. | |
| 2017/0237390 A1 | 8/2017 | Hudson et al. | |
| 2017/0331415 A1 | 11/2017 | Koppi et al. | |
| 2018/0094438 A1 | 4/2018 | Wu et al. | |
| 2018/0097472 A1 | 4/2018 | Anderson et al. | |
| 2018/0102735 A1* | 4/2018 | Nam | H02S 40/34 |
| 2018/0115275 A1 | 4/2018 | Flanigan et al. | |
| 2018/0254738 A1 | 9/2018 | Yang et al. | |
| 2018/0294765 A1 | 10/2018 | Friedrich et al. | |
| 2018/0351502 A1 | 12/2018 | Almy et al. | |
| 2018/0367089 A1 | 12/2018 | Stutterheim et al. | |
| 2019/0030867 A1 | 1/2019 | Sun et al. | |
| 2019/0081436 A1 | 3/2019 | Onodi et al. | |
| 2019/0123679 A1 | 4/2019 | Rodrigues et al. | |
| 2019/0253022 A1 | 8/2019 | Hardar et al. | |
| 2019/0305717 A1 | 10/2019 | Allen et al. | |
| 2020/0109320 A1 | 4/2020 | Jiang | |
| 2020/0144958 A1 | 5/2020 | Rodrigues et al. | |
| 2020/0220819 A1 | 7/2020 | Vu et al. | |
| 2020/0224419 A1 | 7/2020 | Boss et al. | |

(56) References Cited

U.S. PATENT DOCUMENTS

| | | |
|---|---|---|
| 2020/0343397 A1 | 10/2020 | Hem-Jensen |
| 2021/0083619 A1 | 3/2021 | Hegedus |
| 2021/0115223 A1 | 4/2021 | Bonekamp et al. |
| 2021/0159353 A1 | 5/2021 | Li et al. |
| 2021/0301536 A1 | 9/2021 | Baggs et al. |
| 2021/0343886 A1 | 11/2021 | Sharenko et al. |
| 2022/0149213 A1 | 5/2022 | Mensink et al. |
| 2022/0200517 A1* | 6/2022 | Birch ..................... H02S 20/25 |

FOREIGN PATENT DOCUMENTS

| | | |
|---|---|---|
| CN | 202797032 U | 3/2013 |
| CN | 217150978 U | 8/2022 |
| DE | 1958248 A1 | 11/1971 |
| EP | 1039361 A1 | 9/2000 |
| EP | 1837162 A1 | 9/2007 |
| EP | 1774372 A1 | 7/2011 |
| EP | 2446481 A2 | 5/2012 |
| EP | 2784241 A1 | 10/2014 |
| EP | 3772175 A1 | 2/2021 |
| JP | 10046767 A | 2/1998 |
| JP | 2002-106151 A | 4/2002 |
| JP | 2001-098703 A | 10/2002 |
| JP | 2017-027735 A | 2/2017 |
| JP | 2018053707 A | 4/2018 |
| KR | 20090084060 A | 8/2009 |
| KR | 10-1348283 B1 | 1/2014 |
| KR | 10-2019-0000367 A | 1/2019 |
| KR | 10-2253483 B1 | 5/2021 |
| NL | 2026856 B1 | 6/2022 |
| WO | 2010/151777 A2 | 12/2010 |
| WO | 2011/049944 A1 | 4/2011 |
| WO | 2015/133632 A1 | 9/2015 |
| WO | 2018/000589 A1 | 1/2018 |
| WO | 2019/201416 A1 | 10/2019 |
| WO | 2020-159358 A1 | 8/2020 |
| WO | 2021-247098 A1 | 12/2021 |

OTHER PUBLICATIONS

Sunflare, Procducts: "Sunflare Develops Prototype for New Residential Solar Shingles"; 2019 <<sunflaresolar.com/news/sunflare-develops-prototype-for-new-residential-solar-shingles>> retrieved Feb. 2, 2021.

RGS Energy, 3.5kW Powerhouse 3.0 system installed in an afternoon; Jun. 7, 2019 <<facebook.com/RGSEnergy/>> retrieved Feb. 2, 2021.

Tesla, Solar Roof <<tesla.com/solarroof>> retrieved Feb. 2, 2021.

"Types of Roofing Underlayment", Owens Corning Roofing; <<https://www.owenscorning.com/en-us/roofing/tools/how-roofing-underlayment-helps-protect-your-home>> retrieved Nov. 1, 2021.

* cited by examiner

PHOTOVOLTAIC MODULE WITH A LAMINATED POTTED PRINTED CIRCUIT BOARD

CROSS-REFERENCE TO RELATED APPLICATIONS

This application claims priority to U.S. Provisional Application No. 63/163,542, filed Mar. 19, 2021, the entire contents of which are incorporated by reference herein in their entirety.

FIELD

The present disclosure relates to photovoltaic modules for roofs with potted printed circuit boards.

BACKGROUND

Some roofing systems include photovoltaic modules. In some instances, the photovoltaic modules may include module-level power electronics with potted printed circuit boards.

SUMMARY

Covered embodiments are defined by the claims, not this summary. This summary is a high-level overview of various aspects and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to appropriate portions of the entire specification, any or all drawings, and each claim.

Some embodiments of the present disclosure are directed to system, comprising a photovoltaic module; a module-level power electronics (MLPE) device comprising a laminated potted printed circuit board, wherein the laminated potted printed circuit board comprises a potted printed circuit board, wherein the potted printed circuit board comprises a printed circuit board having a top surface and a pottant covering the top surface of the printed circuit board; an encapsulant covering the potted printed circuit board, wherein the encapsulant comprises a polymer, wherein the laminated potted printed circuit board is substantially void-free; and wherein the MLPE device is electrically connected to the photovoltaic module.

In some embodiments, the laminated potted printed circuit board is substantially void-free so as to result in the MPLE device having an ingress protection rating of IP67.

In some embodiments, the encapsulant completely surrounds the potted printed circuit board.

In some embodiments, wherein the pottant comprises a trapezoidal shape.

In some embodiments, the pottant comprises a top surface and a bottom surface, and wherein the top surface of the pottant comprises a round shape.

In some embodiments, the pottant comprises a round, trapezoidal shape.

In some embodiments, the pottant comprises a top surface and a bottom surface, and wherein the top surface of the pottant comprises a flat region and a plurality of round regions.

In some embodiments, each of the plurality of round regions extends from the flat region to the bottom surface of the pottant.

In some embodiments, the printed circuit board comprises a bottom surface, and wherein the pottant does not contact the bottom surface of the printed circuit board.

In some embodiments, the pottant comprises silicone.

In some embodiments, the encapsulant comprises a thickness from 200 μm to 1000 μm.

In some embodiments, the printed circuit board comprises a height, wherein the pottant comprises a height, and wherein the height of the pottant is substantially the same as the height of the printed circuit board.

In some embodiments, the encapsulant comprises polyolefin.

In some embodiments, the encapsulant comprises silicone.

In some embodiments, the encapsulant comprises ethylene-vinyl acetate (EVA).

Some embodiments of the present disclosure are directed to a system, comprising: a photovoltaic module; a module-level power electronics (MLPE) device comprising a laminated potted printed circuit board, wherein the laminated potted printed circuit board comprises: a potted printed circuit board, wherein the potted printed circuit board comprises: a printed circuit board, and a pottant covering at least a portion of the printed circuit board, an encapsulant covering the potted printed circuit board, wherein the laminated potted printed circuit board is substantially void-free so as to result in the MLPE device having an ingress protection rating of IP67; wherein the MPLE device is electrically connected to the photovoltaic module.

In some embodiments, the encapsulant comprises polyolefin, silicone, ethylene-vinyl acetate (EVA), or any combination thereof.

In some embodiments, the printed circuit board comprises a bottom surface, and wherein the pottant does not contact the bottom surface of the printed circuit board.

In some embodiments, the pottant comprises a round, trapezoidal shape.

In some embodiments, the printed circuit board comprises a height, wherein the pottant comprises a height, and wherein the height of the pottant is substantially the same as the height of the printed circuit board.

DRAWINGS

Some embodiments of the disclosure are herein described, by way of example only, with reference to the accompanying drawings. With specific reference now to the drawings in detail, it is stressed that the embodiments shown are by way of example and for purposes of illustrative discussion of embodiments of the disclosure. In this regard, the description taken with the drawings makes apparent to those skilled in the art how embodiments of the disclosure may be practiced.

DETAILED DESCRIPTION

Figure 1:
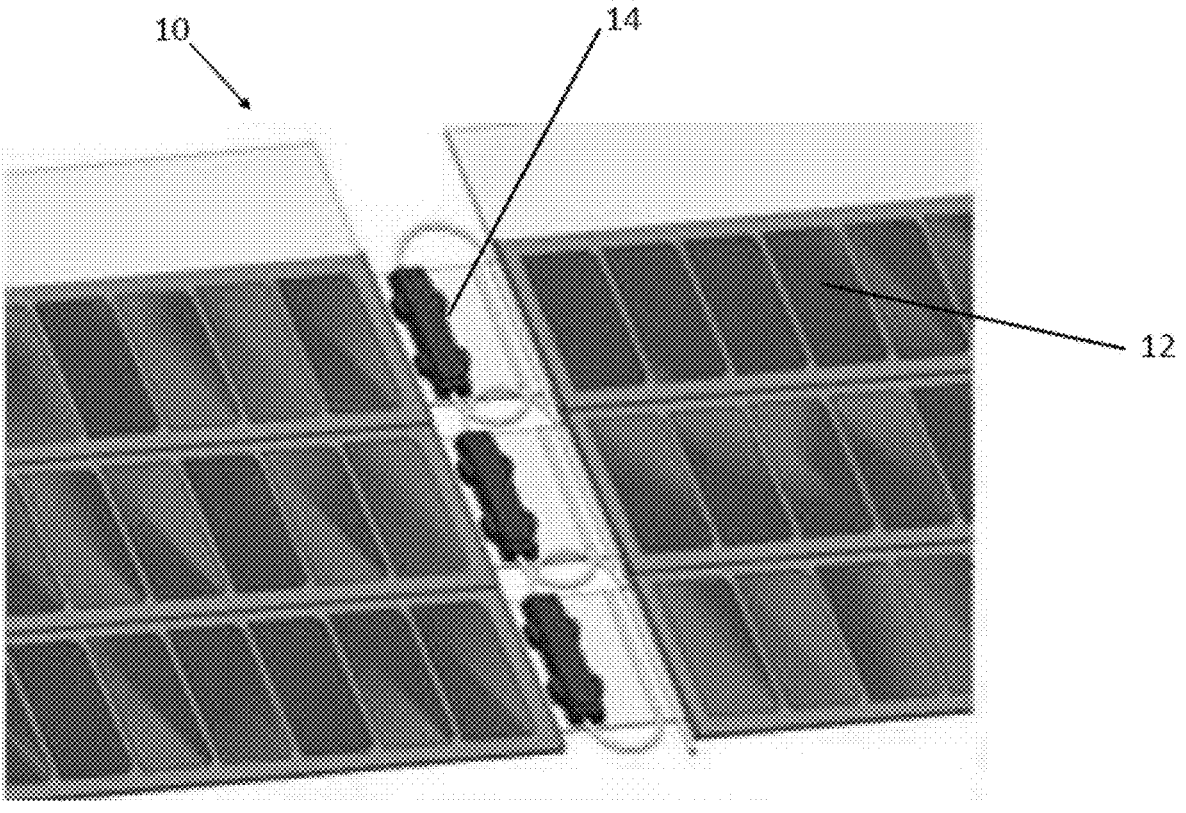
FIG. 1 depicts an exemplary embodiment of a system of the present disclosure.

Among those benefits and improvements that have been disclosed other objects and advantages of this disclosure will become apparent from the following description taken in conjunction with the accompanying figures. Detailed embodiments of the present disclosure are disclosed herein; however, it is to be understood that the disclosed embodiments are merely illustrative of the disclosure that may be embodied in various forms. In addition, each of the examples given regarding the various embodiments of the disclosure which are intended to be illustrative, and not restrictive.

Throughout the specification and claims, the following terms take the meanings explicitly associated herein, unless the context clearly dictates otherwise. The phrases "in one embodiment," "in an embodiment," and "in some embodiments" as used herein do not necessarily refer to the same embodiment(s), though it may. Furthermore, the phrases "in another embodiment" and "in some other embodiments" as used herein do not necessarily refer to a different embodiment, although it may. All embodiments of the disclosure are intended to be combinable without departing from the scope or spirit of the disclosure.

As used herein, the term "based on" is not exclusive and allows for being based on additional factors not described, unless the context clearly dictates otherwise. In addition, throughout the specification, the meaning of "a," "an," and "the" include plural references. The meaning of "in" includes "in" and "on."

As used herein, terms such as "comprising" "including," and "having" do not limit the scope of a specific claim to the materials or steps recited by the claim.

As used herein, the term "consisting essentially of" limits the scope of a specific claim to the specified materials or steps and those that do not materially affect the basic and novel characteristic or characteristics of the specific claim.

As used herein, terms such as "consisting of" and "composed of" limit the scope of a specific claim to the materials and steps recited by the claim.

As used herein, the term "pottant" refers to a material configured to protect a printed circuit board from water, moisture, corrosive agents, or any combination thereof. In some embodiments, the pottant may include polyurethane, silicone, epoxy, or any combination thereof.

As used herein, the term "encapsulant" refers to a material configured to encase an object. In some embodiments, the encapsulant may include a polymer, including, for example, polyolefin, silicone, ethylene-vinyl acetate (EVA), or any combination thereof.

As used herein, the term "module-level power electronics device" is an electronic device that can be electrically connected to a photovoltaic module in a solar system. In some embodiments, the module-level power electronics (MLPE) device may include an optimizer, a rapid shut down device, a communication device, surface-mount diode, a microinverter, a voltage regulation device, a sensor or any combination thereof.

As used herein, the term "optimizer" refers to a converter that is configured to maximize solar energy harvested from a photovoltaic module.

As used herein, the term "potted printed circuit board" refers to a printed circuit board that is at least partially covered with a pottant so as to protect components on the printed circuit board from water, moisture, corrosive agents, or any combination thereof.

As used here, the term "laminated potted printed circuit board" refers to a potted printed circuit board that is at least partially covered by the encapsulant so as to result in a laminated potted printed circuit board that is substantially void-free. In some embodiments, the laminated potted printed circuit board is formed by laminating the encapsulant to the potted printed circuit board.

As used herein, the term "void" refers to a bubble of trapped gas or vacuum.

As used herein, the term "void-free" mean no voids larger than 0.5 mm and no voids that bridge interfaces, electrical connections, or any combination thereof.

All prior patents, publications, and test methods referenced herein are incorporated by reference in their entireties.

Some embodiments of the present disclosure include a system. In some embodiments, the system includes a photovoltaic module. In some embodiments, the photovoltaic module may be sized and/or shaped for use on a roof. In some embodiments, the photovoltaic module may be a solar panel. In some embodiments, the photovoltaic module includes a solar cell. In some embodiments, the photovoltaic module includes a plurality of solar cells.

In some embodiments, the system may include a module-level power electronics (MLPE) device as defined herein. In some embodiments, the MLPE device may include an optimizer, a rapid shut down device, a communication device, surface-mount diode, a microinverter, a voltage regulation device, a sensor or any combination thereof. In some embodiments, the MLPE device may be electrically connected to the photovoltaic module. In some embodiments, the MLPE device may be electrically connected to the photovoltaic module so as to maximize solar energy harvested from a photovoltaic module.

In some embodiments, the MLPE device may include a laminated potted printed circuit board. In some embodiments, the laminated potted printed circuit board may be sized, shaped, and/or configured to enable the MLPE device to electrically connect to the photovoltaic module.

In some embodiments, the laminated potted printed circuit board may include an encapsulant. In some embodiments, the encapsulant may include a polymer, including, for example, polyolefin, silicone, EVA, or any combination thereof. In some embodiments, the encapsulant may include one region of polymer. In some embodiments, the encapsulant may include a plurality of regions of polymers. In some embodiments, each of the plurality of regions of polymers may be comprised of the same polymers. In some embodiments, the regions of polymers may be comprised of different polymers.

In some embodiments, the encapsulant has a thickness of 200 μm to 1000 μm, of 200 μm to 900 μm, of 200 μm to 800 μm, of 200 μm to 700 μm, of 200 μm to 600 μm, of 200 μm to 500 μm, of 200 μm to 400 μm, of 200 μm to 300 μm, of 300 μm to 1000 μm, of 400 μm to 1000 μm, of 500 μm to 1000 μm, of 600 μm to 1000 μm, of 700 μm to 1000 μm, of 800 µm to 1000 µm, of 900 µm to 1000 µm, of 300 µm to 900 µm, of 400 µm to 800 µm, or of 500 µm to 700 µm.

In some embodiments, each region of polymer of the encapsulant has the same thickness. In some embodiments, the regions of polymers of the encapsulant have different thicknesses. In some embodiments, a region of polymer of the encapsulant has a thickness of 200 µm to 1000 µm, of 200 µm to 900 µm, of 200 µm to 800 µm, of 200 µm to 700 µm, of 200 µm to 600 µm, of 200 µm to 500 µm, of 200 µm to 400 µm, of 200 µm to 300 µm, of 300 µm to 1000 µm, of 400 µm to 1000 µm, of 500 µm to 1000 µm, of 600 µm to 1000 µm, of 700 µm to 1000 µm, of 800 µm to 1000 µm, of 900 µm to 1000 µm, of 300 µm to 900 µm, of 400 µm to 800 µm, or of 500 µm to 700 µm.

In some embodiments, the laminated potted printed circuit board may include a potted printed circuit board. In some embodiments, the encapsulant may cover the potted printed circuit board. In some embodiments, the encapsulant may partially cover the potted printed circuit board. In some embodiments, the encapsulant may completely cover the potted printed circuit board. In some embodiments, the encapsulant may cover the potted printed circuit board so as to result in a laminated potted printed circuit board that is substantially void-free.

In some embodiments, the voids are less than 0.5 mm. In some embodiments, the voids are less than 0.4 mm. In some embodiments, the voids are less than 0.3 mm. In some embodiments, the voids are less than 0.2 mm. In some embodiments, the voids are less than 0.1 mm.

In some embodiments, the laminated potted printed circuit board has less than 5 voids. In some embodiments, the laminated potted printed circuit board has less than 4 voids. In some embodiments, the laminated potted printed circuit board has less than 3 voids. In some embodiments, the laminated potted printed circuit board has less than 2 voids.

In some embodiments, the potted printed circuit board may include a printed circuit board. In some embodiments, the printed circuit board may be sized or shaped to enable the MLPE device to be electrically connected to the photovoltaic module. In some embodiments, the printed circuit board may include a top surface and a bottom surface. In some embodiments, the printed circuit board may include components attached to the top surface of the printed circuit board. In some embodiments, the components may each extend a distance from the top surface of the printed circuit board. In some embodiments, the printed circuit board may include a height. In some embodiments, the height of the printed circuit board may be the longest distance that a component extends from the top surface of the printed circuit board.

In some embodiments, the potted printed circuit board may include a pottant. In some embodiments, the pottant may be sized, shaped, and/or configured to cover at least a portion of the printed circuit board so as to form the potted printed circuit board. In some embodiments, the pottant may cover the top surface of the printed circuit board. In some embodiments, at least a portion of the printed circuit board may not be covered by the pottant so as to enable the MLPE device to electrically connect to the photovoltaic module. For example, in some embodiments, the bottom surface of the printed circuit board may not be covered by the pottant. In some embodiments, the pottant does not contact the bottom surface of the printed circuit board.

In some embodiments, the pottant comprises a height. In some embodiments, the height of the pottant is substantially the same as the height of the printed circuit board. In some embodiments, the pottant comprises a top surface and a bottom surface. In some embodiments, the bottom surface of the pottant is substantially flat. In some embodiments, the top surface of the pottant and the bottom surface of the pottant are shaped so as to form a trapezoidal shape.

In some embodiments, the top surface of the pottant is substantially round. In some embodiments, the top surface of the pottant has a flat region and a plurality of round regions so as to form a round, trapezoidal shape. In some embodiments, the top surface of the pottant may include at least two round regions, at least three round regions, at least four round regions, at least five round regions, at least six round regions, at least seven round regions, or at least eight round regions. In some embodiments, each of the plurality of round regions extends from the flat region to the bottom surface of the pottant.

In some embodiments, the flat region of the top surface of the pottant has a length from 0.1" to 1", from 0.2" to 1", from 0.3" to 1", from 0.4" to 1", from 0.5" to 1", from 0.6" to 1", from 0.7" to 1", from 0.8" to 1", from 0.9" to 1", from 0.1" to 0.9", from 0.1" to 0.8", from 0.1" to 0.7", from 0.1" to 0.6", from 0.1" to 0.5", from 0.1" to 0.4", from 0.1" to 0.3", from 0.1" to 0.2", from 0.2" to 0.9", from 0.3" to 0.8", from 0.4" to 7", or from 0.5" to 6".

In some embodiments, the flat region of the top surface of the pottant has a width from 0.1" to 1", from 0.2" to 1", from 0.3" to 1", from 0.4" to 1", from 0.5" to 1", from 0.6" to 1", from 0.7" to 1", from 0.8" to 1", from 0.9" to 1", from 0.1" to 0.9", from 0.1" to 0.8", from 0.1" to 0.7", from 0.1" to 0.6", from 0.1" to 0.5", from 0.1" to 0.4", from 0.1" to 0.3", from 0.1" to 0.2", from 0.2" to 0.9", from 0.3" to 0.8", from 0.4" to 7", or from 0.5" to 6".

In some embodiments, each of the plurality of round regions has a radius from 0.5" to 3", from 0.75" to 3", from 1" to 3", from 1.25" to 3", from 1.5" to 3", from 1.75" to 3", from 2" to 3", from 2.25" to 3", from 2.5" to 3", from 2.75" to 3", from 0.5" to 2.75", from 0.5" to 2.5", from 0.5" to 2.25", from 0.5" to 2", from 0.5" to 1.75", from 0.5" to 1.5", from 0.5" to 1.25", from 0.5" to 1", from 0.5" to 0.75", from 0.75" to 2.75", from 1" to 2.5", from 1.25" to 2.25", or from 1.5" to 2".

In some embodiments, the plurality of round regions of the top surface of the pottant have the same radius. In some embodiments, the plurality of round regions of the top surface of the pottant have different radii.

In some embodiments, the pottant has a thickness from 0.1" to 1", from 0.2" to 1", from 0.3" to 1", from 0.4" to 1", from 0.5" to 1", from 0.6" to 1", from 0.7" to 1", from 0.8" to 1", from 0.9" to 1", from 0.1" to 0.9", from 0.1" to 0.8", from 0.1" to 0.7", from 0.1" to 0.6", from 0.1" to 0.5", from 0.1" to 0.4", from 0.1" to 0.3", from 0.1" to 0.2", from 0.2" to 0.9", from 0.3" to 0.8", from 0.4" to 7", or from 0.5" to 6".

In some embodiments, the pottant has a length from 1" to 3", from 1.25" to 3", from 1.5" to 3", from 1.75" to 3", from 2" to 3", from 2.25" to 3", from 2.5" to 3", from 2.75" to 3", from 1" to 2.75", from 1" to 2.5", from 1" to 2.25", from 1" to 2", from 1" to 1.75", from 1" to 1.5", from 1" to 1.25", from 1.25" to 2.75", from 1.75" to 2.5", or from 2" to 2.25".

In some embodiments, the pottant has a width from 1" to 3", from 1.25" to 3", from 1.5" to 3", from 1.75" to 3", from 2" to 3", from 2.25" to 3", from 2.5" to 3", from 2.75" to 3", from 1" to 2.75", from 1" to 2.5", from 1" to 2.25", from 1" to 2", from 1" to 1.75", from 1" to 1.5", from 1" to 1.25", from 1.25" to 2.75", from 1.75" to 2.5", or from 2" to 2.25".

The present disclosure will now be described with reference to non-limiting exemplary embodiments depicted in FIGS. 1-7.

FIG. 1 depicts an exemplary embodiment of a system 10 of the present disclosure. As shown in FIG. 1, in some embodiments, the system includes a photovoltaic module 12 and a MLPE device 14. In some embodiment, such as the exemplary embodiment of FIG. 1, the MPLE device is optimizer 14. In some embodiments, the optimizer 14 is electrically connected to the photovoltaic module 12.

Figure 2:
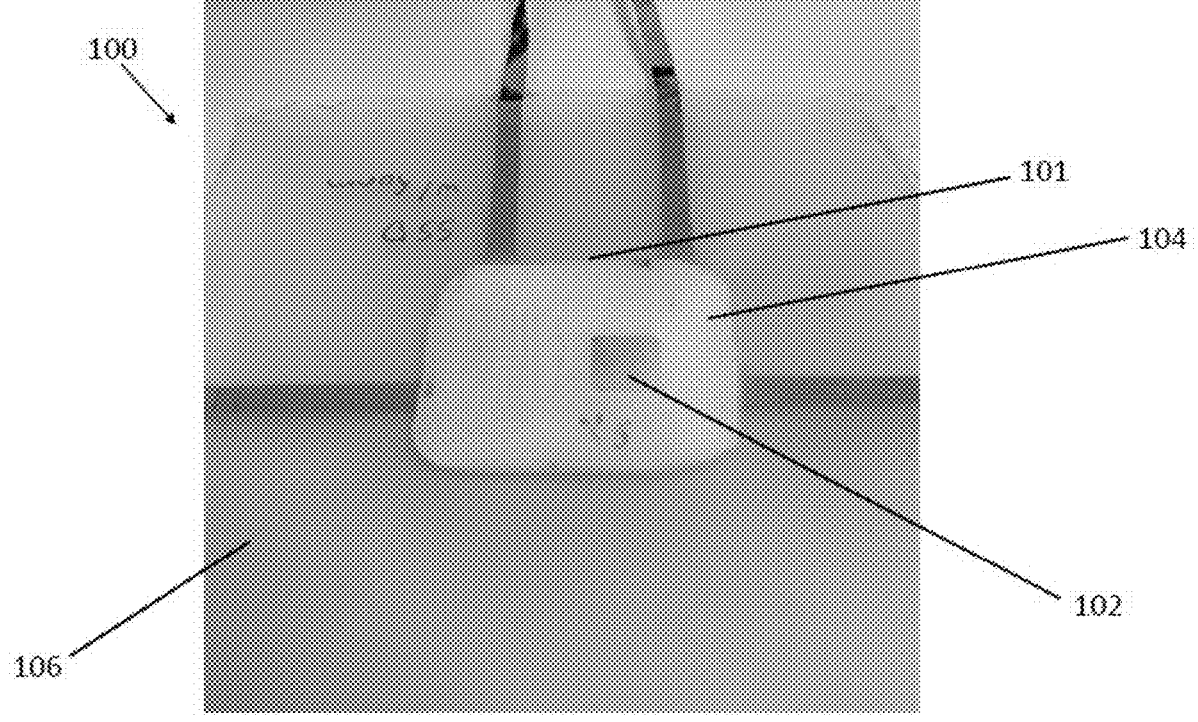
FIG. 2 depicts a laminated potted printed circuit board according to an exemplary embodiment of the present disclosure.

FIG. 2 depicts a laminated potted printed circuit board 100 according to an exemplary embodiment of the present disclosure. In some embodiments of the system 10, the MPLE device 14 may include the laminated potted printed circuit board 100. As shown in FIG. 2, in some embodiments, the laminated potted printed circuit board 100 may include an encapsulant 106 and a potted printed circuit board 101. In the exemplary embodiment of FIG. 2, the potted printed circuit board 101 includes a printed circuit board 102 and a pottant 104. As shown in FIG. 2, in some embodiments, the pottant 104 covers at least a portion of the printed circuit board 102, and the encapsulant 106 covers the potted printed circuit board.

Figure 3:
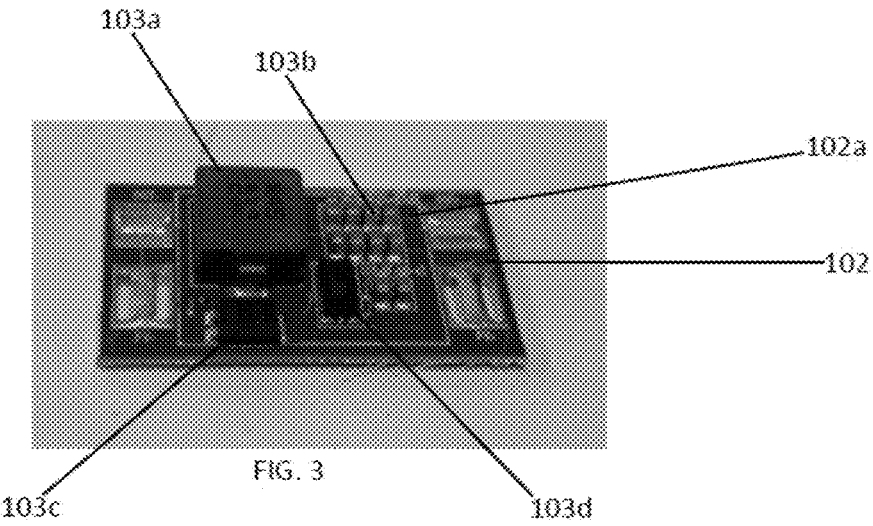
FIG. 3 depicts a top perspective view of a printed circuit board according to an exemplary embodiment of the present disclosure.

FIG. 3 depicts a top perspective view of a printed circuit board 102 according to an exemplary embodiment of the present disclosure. As shown in FIG. 3, the printed circuit board 102 includes a top surface 102a. In addition, a plurality of components 103a, 103b, 103c, 103d are attached to and extend from the top surface of the printed circuit board 102a. In the exemplary embodiment of FIG. 2, the pottant 104 covers the top surface of the printed circuit board 102a.

Figure 4:
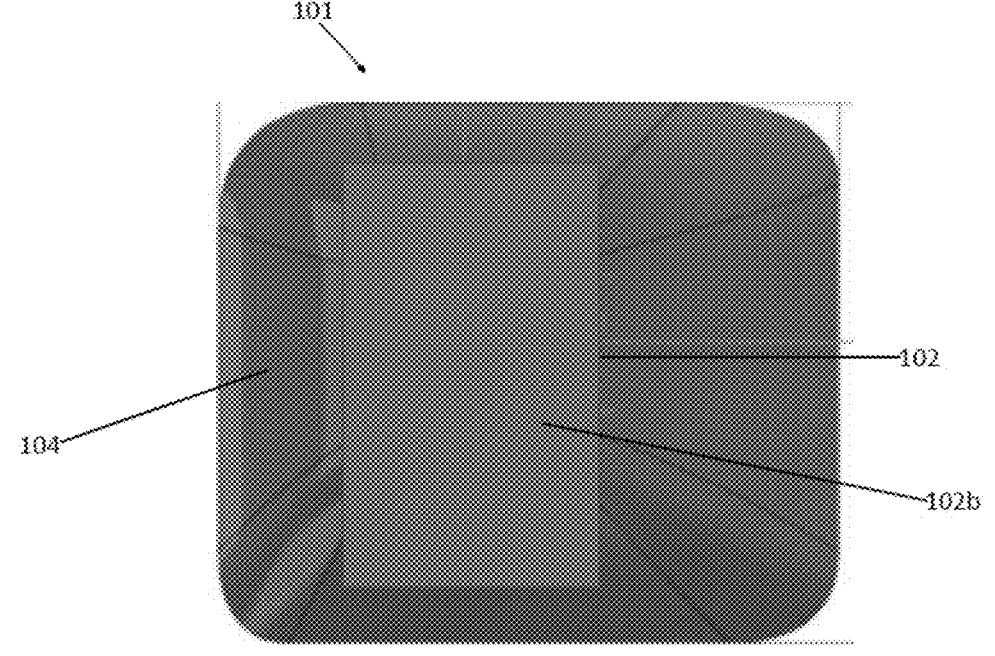
FIG. 4 depicts a bottom view of a potted printed circuit board according to an exemplary embodiment of the present disclosure.

FIG. 4 depicts a bottom view of a potted printed circuit board 101 according to an exemplary embodiment of the present disclosure. As shown in FIG. 4, the printed circuit board 102 includes a bottom surface 102b. In some embodiments, such as the exemplary embodiment of FIG. 4, the pottant 104 does not cover the bottom surface of the printed circuit board 102b.

Figure 5:
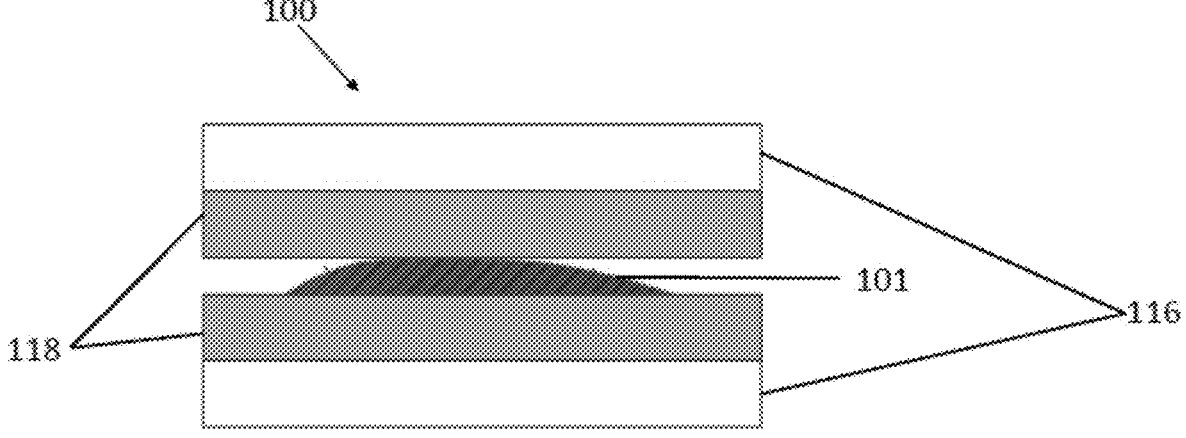
FIG. 5 depicts a cross-sectional view of regions of a laminated potted printed circuit board according to an exemplary embodiment of the present disclosure.

FIG. 5 depicts a cross-sectional view of regions of laminated potted printed circuit board 100 according to an exemplary embodiment of the present disclosure. As shown in FIG. 5, in an exemplary embodiment the laminated potted printed circuit board 100 may include the potted printed circuit board 101. In addition, in some embodiments, the laminated potted printed circuit board 100 may be covered by the encapsulant 106 (FIG. 2). In the exemplary embodiment of FIG. 5, the encapsulant 106 may include a plurality of regions 116, 118. The plurality of regions 116, 118 may include a polymer, including, for example, polyolefin 118 and PET, TPO or any combination thereof 116.

Figure 6A:
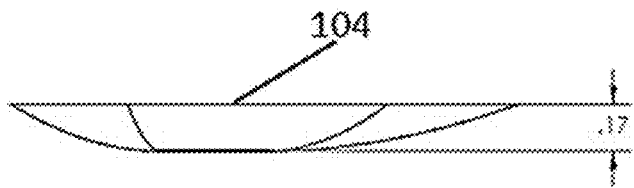
FIGS. 6A-6C depict side, bottom, and perspective views of a pottant according to an exemplary embodiment of the present disclosure.
Figure 6B:
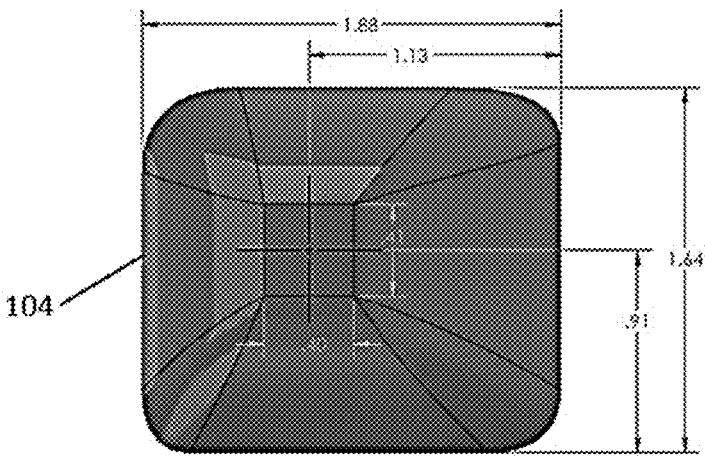
Figure 6C:
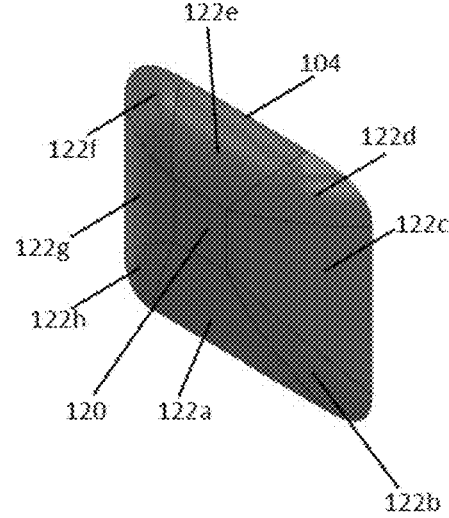

FIGS. 6A-6C depict side (FIG. 6A), bottom (FIG. 6B), and side perspective (FIG. 6C) views of a pottant 104 according to an exemplary embodiment of the present disclosure. As shown in FIG. 6A, the pottant 104 may have a trapezoidal shape. In the exemplary embodiment of FIG. 6C, the pottant may include a top surface having a flat region 120 and a plurality of round regions 122a, 122b, 122c, 122d, 122e, 122f, 122g, 122h. In the embodiment of FIG. 6C, each of the plurality of round regions 122a, 122b, 122c, 122d, 122e, 122f, 122g, 122h extend from the flat region 120 of the pottant 104.

Figures 7A, 7B, 7C:
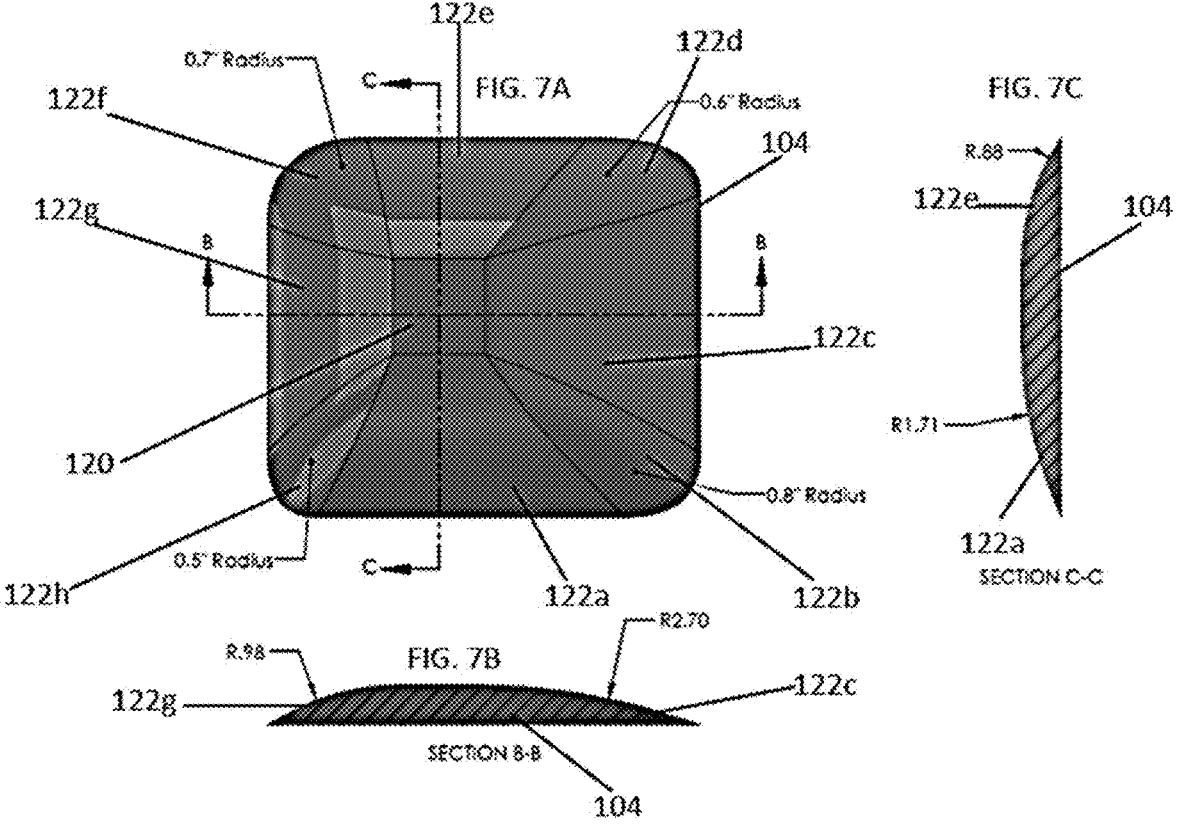
FIG. 7A depicts a bottom view of potting for a pottant according to an exemplary embodiment of the present disclosure.
FIGS. 7B-7C depict cross-sectional views of the pottant of FIG. 8A according to an exemplary embodiment of the present disclosure.

FIG. 7A depicts a bottom view of the pottant 104 according to an exemplary embodiment of the present disclosure. FIGS. 7B-7C depict cross-sectional views of the pottant of FIG. 7A according to an exemplary embodiment of the present disclosure. As shown in FIGS. 7A-7C, the plurality of round regions 122a, 122b, 122c, 122d, 122e, 122f, 122g, 122h each include a radius. In the exemplary embodiment of FIGS. 7A-7C, the radii have different sizes. In some embodiments, two or more of the radii may be the same size.

Variations, modifications and alterations to embodiments of the present disclosure described above will make themselves apparent to those skilled in the art. All such variations, modifications, alterations and the like are intended to fall within the spirit and scope of the present disclosure, limited solely by the appended claims.

While several embodiments of the present disclosure have been described, it is understood that these embodiments are illustrative only, and not restrictive, and that many modifications may become apparent to those of ordinary skill in the art. For example, all dimensions discussed herein are provided as examples only, and are intended to be illustrative and not restrictive.

Any feature or element that is positively identified in this description may also be specifically excluded as a feature or element of an embodiment of the present as defined in the claims.

The disclosure described herein may be practiced in the absence of any element or elements, limitation or limitations, which is not specifically disclosed herein. Thus, for example, in each instance herein, any of the terms "comprising," "consisting essentially of" and "consisting of" may be replaced with either of the other two terms, without altering their respective meanings as defined herein. The terms and expressions which have been employed are used as terms of description and not of limitation, and there is no intention in the use of such terms and expressions of excluding any equivalents of the features shown and described or portions thereof, but it is recognized that various modifications are possible within the scope of the disclosure.

What is claimed:

1. A system, comprising:
a photovoltaic module; and
a module-level power electronics (MLPE) device comprising a laminated potted printed circuit board,
wherein the laminated potted printed circuit board comprises:
a potted printed circuit board,
wherein the potted printed circuit board comprises:
a printed circuit board having a top surface and a bottom surface, and
a pottant layer covering the top surface of the printed circuit board, and
an encapsulant layer,
wherein the encapsulant layer comprises a polymer,
wherein the encapsulant layer encapsulates the bottom surface of the printed circuit board and the pottant layer,
wherein the laminated potted printed circuit board is substantially void-free;
wherein the MLPE device is electrically connected to the photovoltaic module.

2. The system of claim 1, wherein the laminated potted printed circuit board is substantially void-free so as to result in the MLPE device having an ingress protection rating of IP67.

3. The system of claim 1, wherein the pottant layer comprises a trapezoidal shape.

4. The system of claim 1, wherein the pottant layer comprises a top surface and a bottom surface, and wherein the top surface of the pottant layer comprises a round shape.

5. The system of claim 1, wherein the pottant layer comprises a round, trapezoidal shape.

6. The system of claim 1, wherein the pottant layer comprises a top surface and a bottom surface, and wherein the top surface of the pottant layer comprises a flat region and a plurality of round regions.

7. The system of claim 6, wherein each of the plurality of round regions extends from the flat region to the bottom surface of the pottant layer.

8. The system of claim 1, wherein the pottant layer does not contact the bottom surface of the printed circuit board.

9. The system of claim 1, wherein pottant layer comprises silicone.

10. The system of claim 1, wherein the encapsulant layer comprises a thickness from 200 μm to 1000 μm.

11. The system of claim 1, wherein the encapsulant layer comprises polyolefin.

12. The system of claim 1, wherein the encapsulant layer comprises silicone.

13. The system of claim 1, wherein the encapsulant layer comprises ethylene-vinyl acetate (EVA).

14. The system of claim 1, wherein the encapsulant layer comprises a first encapsulant layer, a second encapsulant layer, a third encapsulant layer, and a fourth encapsulant layer, wherein the first encapsulant layer is laminated on an upper surface of the potted printed circuit board, wherein the second encapsulant layer is laminated on the first encapsulant layer, wherein the third encapsulant layer is laminated on a lower surface of the potted printed circuit board, and wherein the fourth encapsulant layer is laminated on the third encapsulant layer.

15. The system of claim 1, wherein the encapsulant layer fully encapsulates the potted printed circuit board without any intervening layer therebetween.

16. A system, comprising:
a photovoltaic module; and
a module-level power electronics (MLPE) device comprising a laminated potted printed circuit board,
wherein the laminated potted printed circuit board comprises:
a potted printed circuit board,
wherein the potted printed circuit board comprises:
a printed circuit board having a top surface and a bottom surface, and
a pottant layer covering at least a portion of the top surface of the printed circuit board, and
an encapsulant layer encapsulating the pottant layer,
wherein the encapsulant layer encapsulates the bottom surface of the printed circuit board,
wherein the laminated potted printed circuit board is substantially void-free so as to result in the MLPE device having an ingress protection rating of IP67;
wherein the MLPE device is electrically connected to the photovoltaic module,
wherein the encapsulant layer comprises silicone, ethylene-vinyl acetate (EVA), or a combination thereof.

17. The system of claim 16, wherein the pottant layer does not contact the bottom surface of the printed circuit board.

18. The system of claim 16, wherein the pottant layer comprises a round, trapezoidal shape.

* * * * *